United States Patent
Liu

(10) Patent No.: US 10,451,777 B2
(45) Date of Patent: Oct. 22, 2019

(54) OPTICAL COMPONENT FOR CONTROLLING LIGHT EMERGENT DIRECTION AND MANUFACTURING METHOD THEREOF

(71) Applicants: BOE TECHNOLOGY GROUP CO., LTD., Beijing (CN); Beijing BOE Display Technology Co., Ltd., Beijing (CN)

(72) Inventor: Jinghai Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/937,903

(22) Filed: Mar. 28, 2018

(65) Prior Publication Data
US 2019/0086585 A1    Mar. 21, 2019

(30) Foreign Application Priority Data
Sep. 21, 2017    (CN) .......................... 2017 1 0860742

(51) Int. Cl.
| | |
|---|---|
| *H01L 33/00* | (2010.01) |
| *G02B 5/00* | (2006.01) |
| *G02B 27/09* | (2006.01) |
| *H01L 33/58* | (2010.01) |

(52) U.S. Cl.
CPC .......... *G02B 5/008* (2013.01); *G02B 27/0944* (2013.01); *H01L 33/58* (2013.01); *H01L 2933/0058* (2013.01); *H01L 2933/0083* (2013.01)

(58) Field of Classification Search
USPC ... 257/40, 66, 98, E21.002, E21.19, E23.01, 257/43, 59, 690, E21.158, E21.257, 257/E21.506, E21.575, E21.589, E23.023, 257/E23.062, 693, 737, 773; 438/34, 438/585, 591, 114, 49, 66, 666, 694, 702, 438/99
See application file for complete search history.

(56) References Cited

U.S. PATENT DOCUMENTS

| | | | | |
|---|---|---|---|---|
| 6,080,529 A | * | 6/2000 | Ye ....................... | H01L 21/0274 430/318 |
| 2006/0181712 A1 | * | 8/2006 | Degertekin ............ | G01B 11/02 356/505 |
| 2009/0073420 A1 | * | 3/2009 | Lin ....................... | G01N 21/553 356/73 |

(Continued)

*Primary Examiner* — Niki H Nguyen
(74) *Attorney, Agent, or Firm* — Calfee, Halter & Griswold LLP

(57) ABSTRACT

The present disclosure relates to the technical field of metal surface plasma and light emitting display, and provides an optical component for controlling a light emergent direction and a manufacturing method thereof. An optical component for controlling a light emergent direction includes: a transparent substrate; a plurality of metal film strips arranged in parallel at equal pitches on the surface of the transparent substrate along a first direction and extending in a second direction that is perpendicular to the first direction; and dielectric gratings formed respectively on the plurality of metal film strips, wherein slits of the dielectric gratings extend along the second direction.

16 Claims, 3 Drawing Sheets

(56) References Cited

U.S. PATENT DOCUMENTS

| | | | | |
|---|---|---|---|---|
| 2011/0285942 A1* | 11/2011 | Guo | ................ | G02B 5/008 |
| | | | | 349/96 |
| 2013/0120672 A1* | 5/2013 | Kumai | ................ | G02F 1/1335 |
| | | | | 349/5 |
| 2014/0073214 A1* | 3/2014 | Wu | ................ | G02B 26/08 |
| | | | | 445/24 |
| 2014/0261536 A1* | 9/2014 | Buhler | ................ | B08B 17/06 |
| | | | | 134/1 |
| 2017/0289703 A1* | 10/2017 | Bartl | ................ | B81C 1/00158 |

* cited by examiner

OPTICAL COMPONENT FOR CONTROLLING LIGHT EMERGENT DIRECTION AND MANUFACTURING METHOD THEREOF

CROSS-REFERENCE TO RELATED APPLICATIONS

This application is based on and claims priority to Chinese Patent Application No. 201710860742.5, filed on Sep. 21, 2017, the entire contents thereof are incorporated herein by reference.

TECHNICAL FIELD

The present disclosure relates to the technical field of metal surface plasma and light emitting display, and in particular, relates to an optical component for controlling a light emergent direction and a manufacturing method thereof.

BACKGROUND

As a frequently utilized light source, LED plays an increasingly important role in various industries, including backlight structures for such as televisions, computers, and mobile phones, in which control of light emergent direction of the LED is of great significance. With a traditional control method, it is difficult to achieve highly collimated and super-diffracted light beams, while controlling light beams in nanometer field is a feasible method.

Although metal surface plasma technology has been developed only for a short time, but with the progress of processing technology and with further understanding of characteristics of surface plasma, surface plasma technology has become a hot spot in the social development nowadays, and has given birth to surface plasma resonance technology, surface spectral enhancement technology and so on, and sensors based on such technology have been widely applied in biomedical, mechanical, physical, chemical and other fields.

As an emerging technology, how to apply the unique properties of the surface plasma to control the light emergent direction of LED is a new topic in the technical field.

SUMMARY

The objective of the present disclosure is to provide an optical component for controlling a light emergent direction and a manufacturing method thereof.

According to a first aspect of the present disclosure, there is provided an optical component for controlling a light emergent direction, including:

a transparent substrate;

a plurality of metal film strips arranged in parallel at equal pitches on the surface of the transparent substrate along a first direction and extending in a second direction that is perpendicular to the first direction; and dielectric gratings formed respectively on the plurality of metal film strips, wherein slits of the dielectric gratings extend along the second direction.

In an exemplary embodiment of the present disclosure, the dielectric grating has a medium refractive index of about 1.6-1.8.

In an exemplary embodiment of the present disclosure, the dielectric grating has a medium refractive index of about 1.72.

In an exemplary embodiment of the present disclosure, a pitch and a thickness of the plurality of metal film strips and a thickness and a period of the dielectric grating are all in the same order of magnitude as a wavelength of emergent light.

In an exemplary embodiment of the present disclosure, the plurality of metal film strips are spaced from one another by a pitch of about 100 nm and each of the metal film strips has a thickness of about 250 nm, and the dielectric grating has a thickness of about 80 nm, wherein a period of the dielectric grating on a metal film strip of an odd number among the plurality of metal film strips is about 305 nm, and a period of the dielectric grating on a metal film strip of an even number among the plurality of metal film strips is about 503 nm.

In an exemplary embodiment of the present disclosure, the plurality of metal film strips are spaced from one another by a pitch of about 100 nm and each of the metal film strips has a thickness of about 250 nm, and the dielectric grating has a thickness of about 80 nm, wherein a period of the dielectric grating on a metal film strip of an odd number among the plurality of metal film strips is about 503 nm, and a period of the dielectric grating on a metal film strip of an even number among the plurality of metal film strips is about 305 nm.

In an exemplary embodiment of the present disclosure, a material of the metal film strip includes silver.

In an exemplary embodiment of the present disclosure, the optical component further includes a light source formed below the transparent substrate.

In an exemplary embodiment of the present disclosure, the light source is a surface light source.

In an exemplary embodiment of the present disclosure, the light source is an LED light source.

According to a second aspect of the present disclosure, there is provided a manufacturing method for an optical component for controlling a light emergent direction, including:

forming a transparent substrate;

forming a plurality of metal film strips arranged in parallel at equal pitches on the surface of the transparent substrate along a first direction and extending in a second direction that is perpendicular to the first direction; and forming dielectric gratings formed respectively on the plurality of metal film strips, wherein slits of the dielectric gratings extend along the second direction.

In an exemplary embodiment of the present disclosure, the manufacturing method further includes:

forming a light source before the transparent substrate is formed, and then forming the transparent substrate on the light source.

It should be understood that both the foregoing general description and the following detailed description are exemplary and explanatory only and are not restrictive of the disclosure.

BRIEF DESCRIPTION OF THE DRAWINGS

The above and other objects, features, and advantages of the present disclosure will become more apparent by describing in detail exemplary embodiments thereof with reference to the accompanying drawings.

The accompanying drawings, which are incorporated in and constitute a part of this specification, illustrate embodiments consistent with the present disclosure and, together with the description, serve to explain the principles of the disclosure. Apparently, the accompanying drawings in the following description show merely some embodiments of the present disclosure, and persons of ordinary skill in the art may still derive other drawings from these accompanying drawings without creative efforts.

FIG. 1 shows an elementary optical diagram of a surface plasma wave.

DETAILED DESCRIPTION

Figure 1:
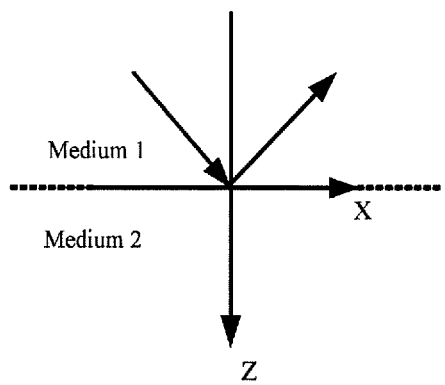

Example embodiments will now be described more fully with reference to the accompanying drawings. However, the exemplary embodiments may be embodied in many forms and should not be construed as limited to the examples set forth herein. The features, structures, or characteristics described may be combined in any suitable manner in one or more embodiments. In the following description, numerous specific details are given to provide a thorough understanding of embodiments of the present disclosure. However, those skilled in the art will recognize that the technical solutions of the present disclosure may be practiced without one or more of the specific details, or that other methods, components, devices, steps, etc. may be employed. The word "about" is used to indicate that the value is not strictly accurate, and there may be an allowable error due to limitations of the accuracy of the measuring device and the manufacturing equipment.

It should be noted that, in the drawings, the size of layers and regions may be exaggerated for clarity of illustration. It will also be understood that when an element or a layer is referred to as being located "on" another element or layer, it can be directly located on the other element or an intermediate layer may be present. In addition, it will be understood that when an element or a layer is referred to as being "under" another element or layer, it can be directly under the other element or one or more intermediate layers may be present. In addition, it will also be understood that when a layer or an element is referred to as being "between" two layers or two elements, it can refer to only one layer between two layers or two elements, or more than one intermediate layer or element may also present. Similar reference numerals refer to similar elements throughout the context.

The present disclosure provides an optical component for controlling a light emergent direction and a manufacturing method thereof. An optical component for controlling a light emergent direction includes a transparent substrate; a plurality of metal film strips arranged in parallel at equal pitches on the surface of the transparent substrate along a first direction and extending in a second direction that is perpendicular to the first direction; dielectric gratings formed respectively on the plurality of metal film strips, wherein the slits of the dielectric gratings extend along the second direction. A method for manufacturing an optical component for controlling a light emergent direction includes: forming a transparent substrate; forming a plurality of metal film strips arranged in parallel at equal pitches on the surface of the transparent substrate along a first direction and extending in a second direction that is perpendicular to the first direction; and forming dielectric gratings respectively on the plurality of metal film strips, wherein the slits of the dielectric gratings extend along the second direction. By controlling the direction of a light beam in the nanometer field with surface plasmas generated on the metal surface, it can thereby achieve overall control of the light emergent direction of the LED, and can improve the coupling between the LEDs and the like in the light source module and a light guide plate. Moreover, the light emergent direction and angle of the light source in the light source module can be accurately controlled by utilizing the surface plasma generated on the metal surface, which lays a foundation for further technical development.

Figure 2:
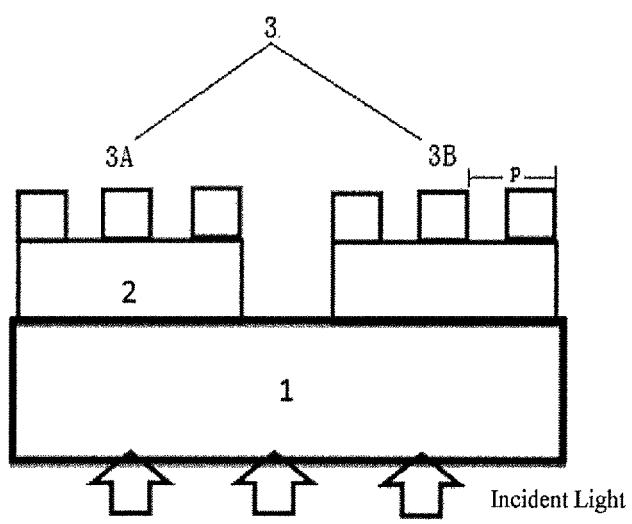
FIG. 2 illustrates a cross-sectional view of an optical component for controlling a light emergent direction according to an exemplary embodiment of the present disclosure.
Figure 3:
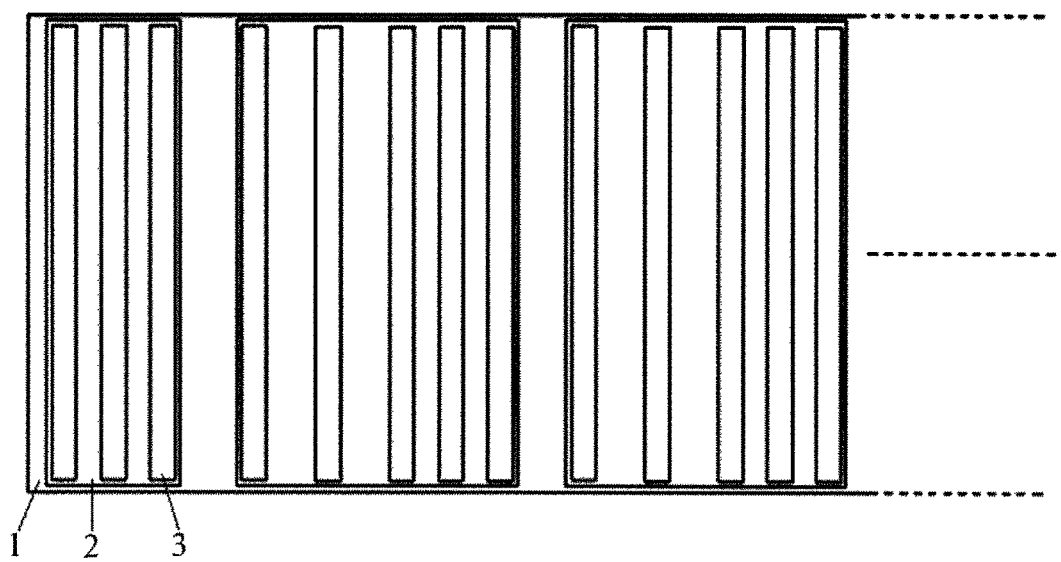
FIG. 3 illustrates a top view of an optical component for controlling a light emergent direction according to an exemplary embodiment of the present disclosure.
Figure 4:
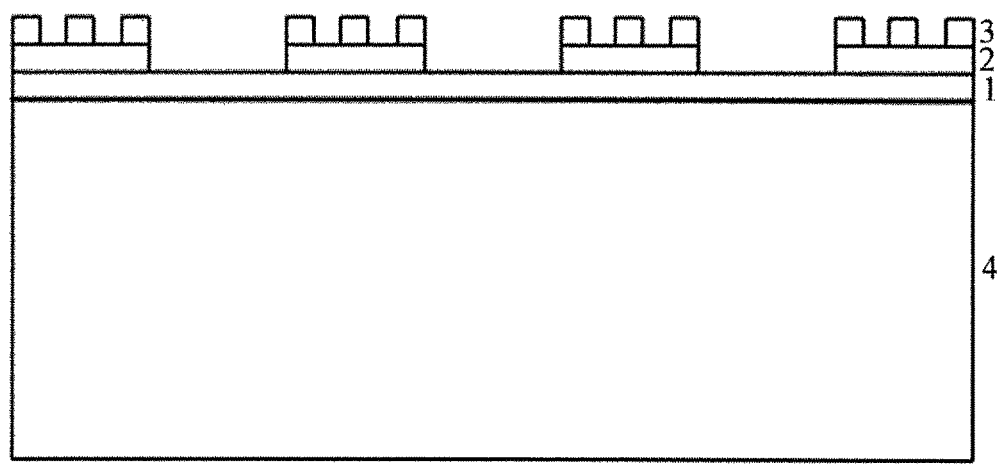
FIG. 4 illustrates a cross-sectional view of another optical component for controlling a light emergent direction according to an exemplary embodiment of the present disclosure.
Figure 5:
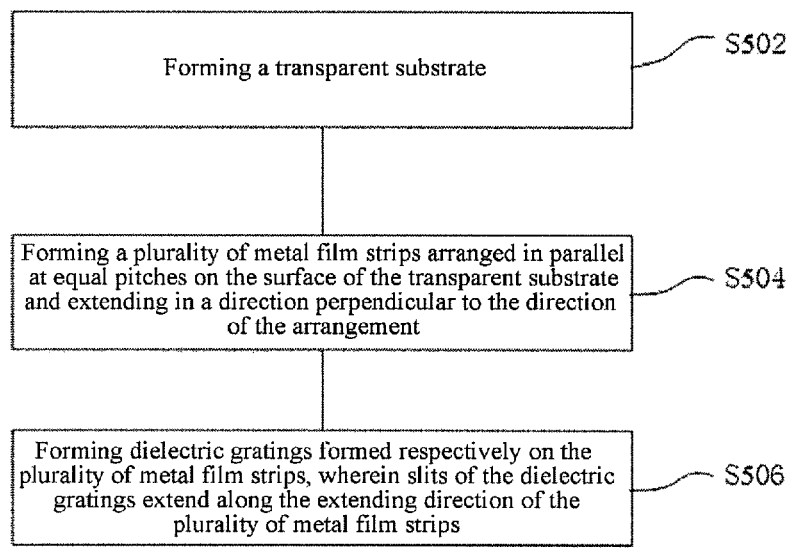
FIG. 5 illustrates a flowchart of a method for manufacturing an optical component for controlling a light emergent direction according to an exemplary embodiment of the present disclosure.

The optical component for controlling a light emergent direction and the manufacturing method thereof according to the present disclosure will be described in detail below with reference to FIGS. 1 to 5. FIG. 1 shows an elementary optical diagram of a surface plasma wave. FIG. 2 illustrates a cross-sectional view of an optical component for controlling a light emergent direction according to an exemplary embodiment of the present disclosure. FIG. 3 illustrates a top view of an optical component for controlling a light emergent direction according to an exemplary embodiment of the present disclosure. FIG. 4 illustrates a cross-sectional view of another optical component for controlling a light emergent direction according to an exemplary embodiment of the present disclosure. FIG. 5 illustrates a flowchart of a method for manufacturing an optical component for controlling a light emergent direction according to an exemplary embodiment of the present disclosure.

Firstly, with reference to FIGS. 1-3, an optical component for controlling a light emergent direction according to an exemplary embodiment of the present disclosure will be described in detail. FIG. 1 shows an elementary optical diagram of a surface plasma wave. FIG. 2 illustrates a cross-sectional view of an optical component for controlling a light emergent direction according to an exemplary embodiment of the present disclosure. FIG. 3 illustrates a top view of an optical component for controlling a light emergent direction according to an exemplary embodiment of the present disclosure.

Free-moving electrons present on the metal surface may force the electrons to oscillate collectively. However, due to the blocking effect of the metal, electron oscillation perpendicular to the surface of metal and medium may appear in the form of an electron dilatational wave. Such wave formed is the surface plasma. In this case, it may be considered as plasma present on the metal surface which consists of positive ions of metal, oscillating electrons and neutral particles, called surface plasma.

When gas is heated to a certain extent, ionization phenomenon may be generated, and such neutral gas is called plasma. Similarly, free-moving electrons are present on the metal surface. When an external magnetic field is applied on the metal surface, for example under the action of illumination of light (light is an electromagnetic wave), due to the energy of light, the energy causes the electrons on the metal surface to oscillate collectively. However, due to the blocking effect of the metal, electron oscillation perpendicular to the surface of metal and medium (air or other medium) may appear in the form of an electron dilatational wave. Such wave formed is similar to the plasma gas, and may be considered as plasma present on the metal surface which consists of positive ions of metal, oscillating electrons and neutral particles, called surface plasma. When the incident light wave interacts with the wave field caused by electron oscillation, generating a wave referred to as surface plasmon. That is, surface plasmon is a kind of mixed wave. Such wave spreads on the metal surface and attenuates very fast. Therefore, the energy of the surface plasma wave mainly concentrates on the metal surface, resulting in significant increase of intensity of the proximity field of the metal surface. Therefore, the metal surface is very sensitive to changes in each feature. This is the theoretical basis for surface plasma application technology.

To utilize the surface plasma wave, first of all, the condition that the surface plasma wave can interact with the incident light wave needs to be satisfied. It can be seen that their frequencies differ greatly and they cannot directly interact with each other. Therefore, certain technical means are required. At present, the most commonly used method is the prism total reflection method. When incident light of a certain wavelength passes through the prism medium and total reflection occurs, surface plasmon may be generated on the contacting surface of the metal and the prism, and the generated surface plasmon can interact with the incident light.

Light is an electromagnetic wave and has all the characteristics of electromagnetic waves. The electromagnetic wave in vacuum is generated by the mutual excitation of the electric field and the magnetic field, so the electric field strength and the magnetic field strength follow the Maxwell's equations. In the optical system shown in FIG. 1, medium 1 and medium 2 are mediums having relative permittivity of $\varepsilon_{1r}$ and $\varepsilon_{2r}$, respectively, and the two media have no free charge, free current, and no magnetic property.

According to the Maxwell's equations and the boundary conditions, dispersion of the surface plasma wave can be derived as:

$$k_s = \frac{\omega}{c}\sqrt{\frac{\varepsilon_{1r}\left(1 - \frac{\omega_p^2}{\omega^2}\right)}{\varepsilon_{1r} + 1 - \frac{\omega_p^2}{\omega^2}}}$$

Based on the relationship $k_p = w_p/c$ between the frequency and the wave vector of the oscillating electromagnetic wave of the metal electron gas, the equation can be further transformed to:

$$\frac{k_s}{k_p} = \frac{\omega}{w_p}\sqrt{\frac{\varepsilon_{1r}\left(1 - \frac{\omega^2}{\omega_p^2}\right)}{1 - (1 + \varepsilon_{1r})\frac{\omega^2}{\omega_p^2}}}$$

The component of the wave vector of the incident light at the interface can be expressed as $$k_1 = \sqrt{\varepsilon_{1r}}\frac{\omega}{c}\sin\theta,$$

further transformed to:

$$\frac{k_1}{k_p} = \frac{\omega}{w_p}\frac{\omega}{c}\sin\theta$$

Since, and $$\sqrt{\frac{\varepsilon_{1r}\left(1 - \frac{\omega^2}{\omega_p^2}\right)}{1 - (1 + \varepsilon_{1r})\frac{\omega^2}{\omega_p^2}}} > 1,$$

the horizontal component of the wave vector of the surface plasma wave is always greater than the horizontal component of the wave vector of the electromagnetic wave of the incident light of any frequency. There can be no intersection between the two. In order to make the two resonate, the dispersion curves of the two needs to have an intersection point. In order to meet the requirements, there are mainly three methods at present. One method is to utilize total internal reflection of a prism, and another method is to utilize diffraction of a periodic undulating structure of the metal surface. The third method is to utilize scattering of a surface morphology of sub-wavelength or a probe. With the above control, the surface plasma can be coupled with the incident light to achieve the function of controlling light beams.

Based on the above principles and analysis, as shown in FIGS. 2-3, the present disclosure provides an optical component for controlling a light emergent direction, including: a transparent substrate 1; a plurality of metal film strips 2 arranged in parallel at equal pitches on the surface of the transparent substrate along a first direction and extending in a second direction that is perpendicular to the first direction; and dielectric gratings 3 formed respectively on the plurality of metal film strips, wherein the slits of the dielectric gratings 3 extend along the second direction. As shown in FIG. 3, taking a rectangular transparent substrate as an example, the first direction may be a direction parallel to the long side of the rectangular transparent substrate, and correspondingly, the second direction may be a direction parallel to the short side of the substrate. It should be understood that FIG. 3 is merely an example, and the present invention is not limited thereto. By controlling the direction of a light beam in the nanometer field with surface plasmas generated on the metal surface, it can thereby achieve overall control of the light emergent direction of the LED.

In an exemplary embodiment of the present disclosure, the dielectric grating has a medium refractive index of about 1.6 to 1.8, and in this refractive index range, the surface plasmas and the incident light are coupled to each other to a greater degree or the surface plasmas and the incident light are react to each other with a larger intensity. Correspondingly, the control capability to the light emergent direction is also stronger. The dielectric grating may be made of an inorganic glass material such as optical glass, such as K9, K10, K11 and K12 and other optical glass. However, the present disclosure is not limited thereto, and it may also be made of organic material such as polyethylene terephthalate (PET), polypropylene (PP) and polyvinyl chloride (PVC).

In an exemplary embodiment of the present disclosure, the medium refractive index of the dielectric grating is about 1.72, and at this time, the optimal coupling effect of the surface plasma with the incident light can be achieved.

In an exemplary embodiment of the present disclosure, the pitch and the thickness of the plurality of metal film strips and the thickness and the period of the dielectric grating are all in the same order of magnitude as the wavelength of the emergent light.

In an exemplary embodiment of the present disclosure, the plurality of metal film strips are spaced from one another by a pitch of about 100 nm, and each of the plurality of metal film strips has a thickness of about 250 nm, and the dielectric grating has a thickness of 80 nm. The period of the dielectric grating on a metal film strip of an odd number among the plurality of metal film strips is about 305 nm, and the period of the dielectric grating on a metal film strip of an even number among the plurality of metal film strips is about 503 nm.

In an exemplary embodiment of the present disclosure, the plurality of metal film strips are spaced apart from one another by a pitch of about 100 nm, and each of the plurality of metal film strips has a thickness of about 250 nm, and the dielectric grating has a thickness of about 80 nm. The period of the dielectric grating on a metal film strip of an odd number among the plurality of metal film strips is about 503 nm, and the period of the dielectric grating on a metal film strip of an even number among the plurality of metal film strips is about 305 nm.

As an example, the transparent substrate 1 may be made of glass, a plurality of slits with a width of about 100 nm (that is, a pitch between each two adjacent metal film strips 2 is about 100 nm) are processed on a metal film made of Ag. Dielectric gratings 3 each with a thickness of about 80 nm are formed on the surfaces of the metal film stripes on both sides of a slit, each with a medium refractive index of about 1.72. When the periods of the dielectric gratings on both sides of the slit are about 305 nm (for the grating 3A) and about 503 nm (for the grating 3B) respectively, since the grating 3A and the grating 3B can excite Surface Plasmon Polariton (SSP) (that is, the surface plasma wave interacts with the incident light wave) only when the grating 3A and the grating 3B receive light beams of different incident angles, the light beams formed will deviate with an angle of about 20.2°.

According to the theoretical analysis of the angle θ of the emergent light, $k_{sp}$ is the wave vector of the surface plasma, $k_0$ is the wave vector of the incident light, m is an integer, P is a period, and the relationship among them is:

$$k_{sp} \pm m\frac{2\pi}{p} = k_0 \sin\theta$$

In summary, according to the above formula representing the relationship among the grating period p and the angle θ of the emergent light, the direction/angle of the emergent light can be controlled by controlling parameters such as the period of the grating. However, the wave vector $k_{sp}$ of the surface plasma can also be adjusted by adjusting parameters such as the pitch and the thickness of the plurality of metal film strips and the medium refractive index of the dielectric grating, so as to finally achieve the direction/angle control of the emergent light.

In an exemplary embodiment of the present disclosure, the transparent substrate may be a glass substrate, but the disclosure is not limited thereto, and it may be other transparent inorganic or organic materials.

In one exemplary embodiment of the present disclosure, the metal film strip is made of a material including Ag, but the present disclosure is not limited thereto, and it may be other metal materials, such as aluminum, gold or the like. Alternatively, the silver film strip is covered with an anti-oxidation layer, and the anti-oxidation layer may be made of gold or other metal with strong anti-oxidation ability.

In an exemplary embodiment of the present disclosure, the optical component further includes a light source formed below the transparent substrate.

In an exemplary embodiment of the present disclosure, the light source is a surface light source, as shown in FIG. 4.

In an exemplary embodiment of the present disclosure, the light source is an LED light source, but the disclosure is not limited thereto, and it may be other light sources such as a fluorescent lamp.

FIG. 5 illustrates a flowchart of a method for manufacturing an optical component for controlling a light emergent direction according to an exemplary embodiment of the present disclosure. As shown in FIG. 5, the method for manufacturing the optical component for controlling a light emergent direction has the following steps.

In S502, a transparent substrate is formed. The transparent substrate may be a glass substrate, but the present disclosure is not limited thereto, and it may be other transparent inorganic or organic materials.

In S504, a plurality of metal film strips are arranged in parallel at equal pitches on the surface of the transparent substrate along a first direction and extending in a second direction that is perpendicular to the first direction. The material of the metal film strips may include silver, but the disclosure is not limited thereto and it may be made of other metal materials, such as, aluminum, gold and other materials of similar features.

In S506, dielectric gratings are formed on the plurality of metal film strips, wherein the slits of the dielectric grating extend along the second direction, that is, the extending direction of the plurality of metal film strips.

Wherein the pitch and the thickness of the plurality of metal film strips and the thickness and the period of the dielectric grating are all in the same order of magnitude as the wavelength of the emergent light.

In an exemplary embodiment of the present disclosure, the manufacturing method further includes:

forming a light source before the transparent substrate is formed, and then forming the transparent substrate on the light source.

In an exemplary embodiment of the present disclosure, the light source is a surface light source.

In an exemplary embodiment of the present disclosure, the light source is an LED light source, but the disclosure is not limited thereto, and it may be other light sources such as a fluorescent lamp.

From the above detailed description, it is easily understood by those skilled in the art that the optical component for controlling a light emergent direction and the manufacturing method thereof according to the exemplary embodiment of the present disclosure have one or more of the following advantages.

According to some embodiments of the present disclosure, in the optical component for controlling a light emergent direction, by controlling the direction of a light beam in the nanometer field with surface plasmas generated on the metal surface, it can thereby achieve overall control of the light emergent direction of the LED, and can improve the coupling between the LEDs and the like in the light source module and a light guide plate.

According to some embodiments of the present disclosure, in the optical component for controlling a light emergent direction, the light emergent direction and angle of the light source in the light source module can be accurately controlled by utilizing the surface plasma generated on the metal surface, which lays a foundation for further technical development.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. An optical component for controlling a light emergent direction, comprising:
   a transparent substrate;
   a plurality of metal film strips, arranged in parallel at equal pitches on a surface of the transparent substrate along a first direction and each extending in a second direction that is perpendicular to the first direction, the plurality of metal film strips spaced apart from one another by a pitch of about 100 nm, each of the metal film strips having a thickness of about 250 nm;
   dielectric gratings having a thickness of about 80 nm, formed respectively on the plurality of metal film strips, wherein slits of the dielectric gratings extend along the second direction; and
   wherein a period of the dielectric grating on a metal film strip of an odd number among the plurality of metal film strips is about 305 nm, and a period of the dielectric grating on a metal film strip of an even number among the plurality of metal film strips is about 503 nm.

2. The optical component according to claim 1, wherein the dielectric grating has a medium refractive index of 1.6-1.8.

3. The optical component according to claim 1, wherein the dielectric grating has a medium refractive index of about 1.72.

4. The optical component according to claim 1, wherein a pitch and a thickness of the plurality of metal film strips and a thickness and a period of the dielectric grating are all in the same order of magnitude as a wavelength of emergent light for which an emergent direction is to be controlled.

5. The optical component according to claim 1, wherein a material of the metal film strip includes silver.

6. The optical component according to claim 1, wherein the optical component further comprises a light source formed below the transparent substrate.

7. The optical component according to claim 6, wherein the light source is a surface light source.

8. The optical component according to claim 6, wherein the light source is an LED light source.

9. A manufacturing method for an optical component for controlling a light emergent direction, comprising:
   forming a transparent substrate;
   forming a plurality of metal film strips arranged in parallel at equal pitches on the surface of the transparent substrate along a first direction and each extending in a second direction that is perpendicular to the first direction, plurality of metal film strips are spaced from one another by a pitch of about 100 nm, each of the metal film strips having a thickness of about 250 nm;
   forming dielectric gratings having a thickness of about 80 nm, formed respectively on the plurality of metal film strips, wherein slits of the dielectric gratings extend along the second direction; and
   wherein a period of the dielectric grating on a metal film strip of an odd number among the plurality of metal film strips is about 305 nm, and a period of the dielectric grating on a metal film strip of an even number among the plurality of metal film strips is about 503 nm.

10. The manufacturing method according to claim 9, further comprising:
    forming a light source before the transparent substrate is formed, and then forming the transparent substrate on the light source.

11. The manufacturing method according to claim 9, wherein the dielectric grating has a medium refractive index of 1.6-1.8.

12. The manufacturing method according to claim 9, wherein the dielectric grating has a medium refractive index of about 1.72.

13. The manufacturing method according to claim 9, wherein a pitch and a thickness of the plurality of metal film strips and a thickness and a period of the dielectric grating are all in the same order of magnitude as a wavelength of emergent light for which an emergent direction is to be controlled.

14. The manufacturing method according to claim 9, wherein a material of the metal film strip includes silver.

15. The manufacturing method according to claim 9, wherein the optical component further comprises a light source formed below the transparent substrate.

16. The manufacturing method according to claim 9, wherein the light source is a surface light source.

* * * * *